United States Patent
Flachowsky et al.

(10) Patent No.: US 9,218,976 B2
(45) Date of Patent: Dec. 22, 2015

(54) FULLY SILICIDED GATE FORMED ACCORDING TO THE GATE-FIRST HKMG APPROACH

(71) Applicant: GLOBALFOUNDRIES Inc., Grand Cayman (KY)

(72) Inventors: Stefan Flachowsky, Dresden (DE); Gerd Zschaetzsch, Dresden, DE (US); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 134 days.

(21) Appl. No.: 13/965,860

(22) Filed: Aug. 13, 2013

(65) Prior Publication Data

US 2015/0050787 A1 Feb. 19, 2015

(51) Int. Cl.
*H01L 21/3205* (2006.01)
*H01L 21/4763* (2006.01)
*H01L 21/28* (2006.01)
*H01L 29/66* (2006.01)
*H01L 21/8238* (2006.01)
*H01L 29/49* (2006.01)

(52) U.S. Cl.
CPC ...... *H01L 21/28097* (2013.01); *H01L 21/8238* (2013.01); *H01L 29/4966* (2013.01); *H01L 29/66477* (2013.01)

(58) Field of Classification Search
None
See application file for complete search history.

(56) References Cited

U.S. PATENT DOCUMENTS

| | | | |
|---|---|---|---|
| 6,194,279 B1 * | 2/2001 | Chen et al. | 438/303 |
| 6,821,887 B2 | 11/2004 | Wieczorek et al. | |
| 2003/0186558 A1 * | 10/2003 | Brenner | 438/760 |
| 2005/0026379 A1 * | 2/2005 | Kammler et al. | 438/303 |
| 2006/0172492 A1 * | 8/2006 | Froment et al. | 438/257 |
| 2007/0278593 A1 * | 12/2007 | Watanabe | 257/374 |
| 2008/0153241 A1 * | 6/2008 | Hsu et al. | 438/305 |
| 2013/0034942 A1 * | 2/2013 | Pal et al. | 438/285 |

* cited by examiner

*Primary Examiner* — Sonya D McCall Shepard
(74) *Attorney, Agent, or Firm* — Amerson Law Firm, PLLC

(57) ABSTRACT

When forming field-effect transistors, a common problem is the formation of a Schottky barrier at the interface between a metal thin film in the gate electrode and a semiconductor material, typically polysilicon, formed thereupon. Fully silicided gates are known in the state of the art, which may overcome this problem. However, formation of a fully silicided gate is hindered by the fact that silicidation of the source and drain regions and of the gate electrode are normally performed simultaneously. The claimed method proposes two consecutive silicidation processes which are decoupled with respect to each other. During the first silicidation process, a metal silicide is formed forming an interface with the source and drain regions and without affecting the gate electrode. During the second silicidation, a metal silicide layer having an interface with the gate electrode is formed, without affecting the transistor source and drain regions.

19 Claims, 13 Drawing Sheets

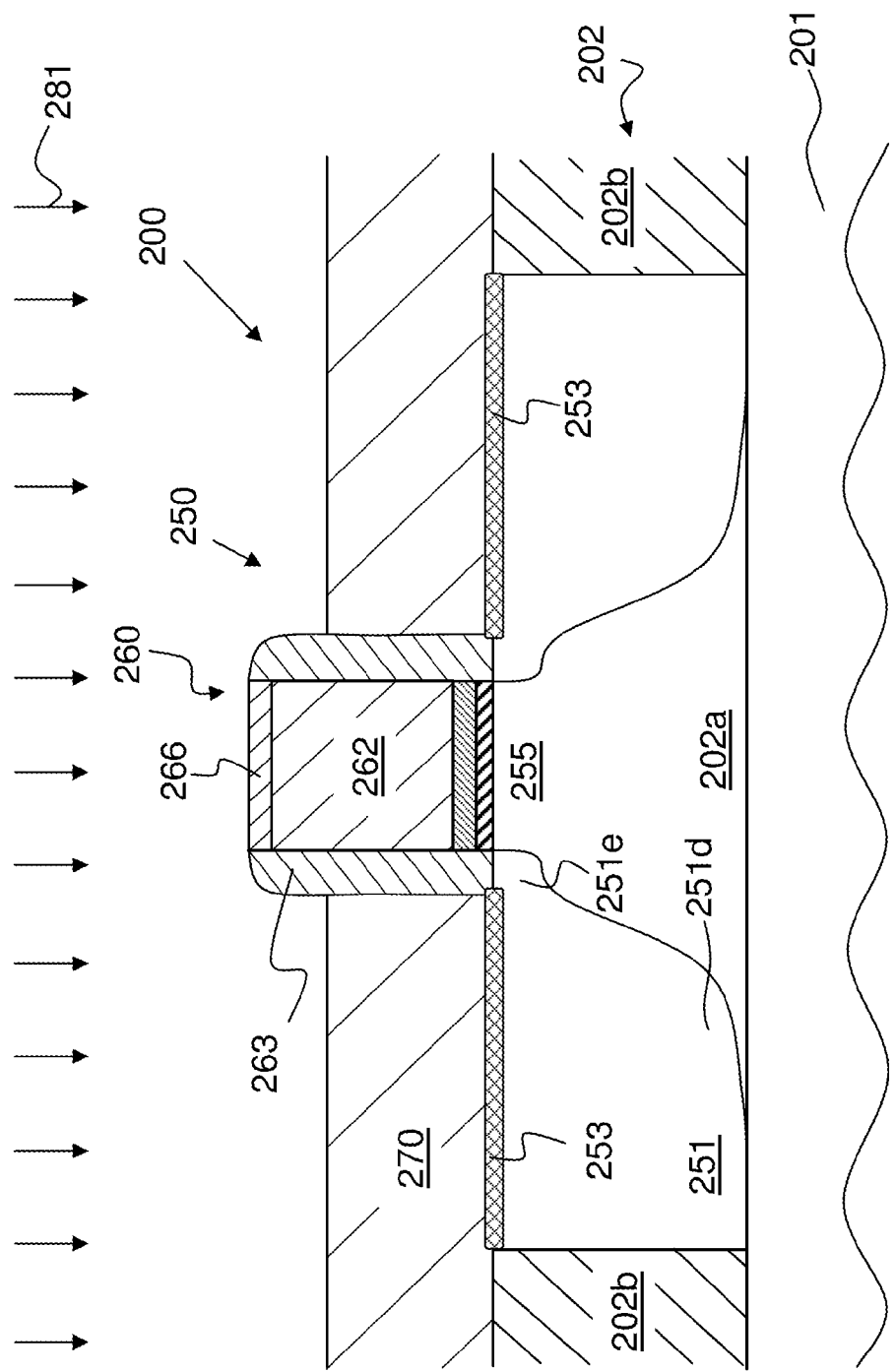

FULLY SILICIDED GATE FORMED ACCORDING TO THE GATE-FIRST HKMG APPROACH

BACKGROUND OF THE INVENTION

1. Field of the Invention

Generally, the present disclosure relates to integrated circuits, and, more particularly, to transistors comprising a gate with a metal layer.

2. Description of the Related Art

Transistors are the dominant components in modern electronic devices. Currently, several hundred millions of transistors may be provided in presently available complex integrated circuits, such as microprocessors, CPUs, storage chips and the like. It is then crucial that the typical dimensions of the transistors included in an integrated circuit have as small as possible typical dimensions, so as to enable a high integration density.

One of the most widespread technologies is the complementary metal-oxidesemiconductor (CMOS) technology, wherein complementary field effect transistors (FETs), i.e., P-channel FETs and N-channel FETs, are used for forming circuit elements, such as inverters and other logic gates, to design highly complex circuit assemblies.

Transistors are usually formed in active regions defined within a semiconductor layer supported by a substrate. Presently, the layer in which most integrated circuits are formed is made out of silicon, which may be provided in crystalline, polycrystalline or amorphous form. Other materials, such as, for example, dopant atoms or ions, may be introduced into the original semiconductor layer.

When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices.

Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

HKMG enables increasing the thickness of the insulation layer in the gate electrode, thereby significantly reducing leakage currents through the gate, even at transistor channel typical sizes as low as 30 nm or smaller. However, implementation of HKMG brings about new technological challenges and requires new integration schemes with respect to the conventional poly/SiON technology.

For example, new materials have to be found in order to tune the work function of gate electrode species, so as to adjust the transistor threshold voltage to a desired level.

In the gate-first HKMG approach, a thin film of a silicon/germanium (SiGe) alloy is deposited on the surface of the silicon layer in order to adjust the transistor threshold voltage to a desired level. Since a portion of this thin film is included in the channel region of the FET, this SiGe thin film is also commonly referred to as "channel SiGe."

Since epitaxial SiGe epitaxially grown on silicon experiences a compressive stress, SiGe alloys may also be used to introduce a desired stress component into the channel region of a P-channel FET. This is a desirable effect since the mobility of holes in the channel region of a P-channel FET is known to increase when the channel region experiences a compressive stress. Thus, trenches may be formed in portions of the source and drain regions of a FET adjacent to the channel region. An SiGe alloy may be subsequently epitaxially grown in the trenches. This SiGe is also commonly referred to as "embedded SiGe."

Furthermore, in the HKMG technology, a thin "work function metal" layer is inserted between the high-k dielectric and the gate material placed above the high-k dielectric. The threshold voltage may thus be adjusted by varying the thickness of the metal layer. The gate metal layer may comprise, for example, tantalum (Ta), tungsten (W), titanium nitride (TiN) or tantalum nitride (TaN). A work function metal, such as, for example, aluminum, may also be included in the gate metal layer.

Since the gate material formed on top of the gate metal layer is usually a semiconductor, for example poly-Si, a Schottky barrier is established at the interface between the gate metal layer and the gate semiconductor material. This undesirably degrades the AC performance by limiting the circuit switching speed.

FIGS. 1a-1c show some aspects of a transistor manufacturing flow according to the known gate-first HKMG approach.

FIG. 1a schematically illustrates a cross-sectional view of a semiconductor structure 100 in an advanced manufacturing stage. The semiconductor structure 100 has been obtained after forming insulation regions 102b in a semiconductor layer 102. Insulation regions 102b may have been formed as shallow trench isolations. The semiconductor layer 102, typically comprising monocrystalline silicon, is formed on a substrate 101, which may be comprised of any appropriate carrier.

Active regions 102a are subsequently formed in the semiconductor layer 102. This may comprise performing one or more well implantations. Active regions are to be understood as semiconductor regions in and above which one or more transistors are to be formed. For convenience of display, a single active region 102a is illustrated, which is laterally limited by insulation regions 102b.

FIG. 1a shows that a FET 150 has been formed after defining the active region 102a. In the gate-first HKMG, a gate structure 160 is formed on the upper surface of the active region 102a. Although not shown, a thin channel SiGe film may have been deposited on the surface of the active region 102a before forming the gate structure 160.

The gate structure 160 is formed by sequentially stacking layers of different materials, which are subsequently patterned so as to obtain the desired gate structure size and dimensions. The stack making up the gate structure 160 comprises: insulation layer 161 formed on the surface of the active region 102a; gate metal layer 164; gate material 162; and a cap layer (not shown) formed adjacent to the gate material 162 and exposing an upper surface to the outside. The gate stack is usually laterally delimited by a spacer structure 163, which may be advantageously used as an implantation mask in subsequent manufacturing stages.

The insulation layer 161, formed on the surface of the active region 102a, comprises a high-k material. The gate metal layer 164 is formed between the insulation layer 161 and the gate material 162 so as to adjust the transistor threshold voltage. The gate material 162, formed directly on the upper surface of the gate metal layer 164, typically comprises a semiconductor, such as poly Si. The cap layer is formed at the top of the gate stack and usually is comprised of an insulating, relatively tough material such as, for example, silicon nitride ($Si_3N_4$).

Where needed, embedded SiGe alloy layers may be formed in the active region 102a after forming the gate structure 160.

Thereafter, several implantations are carried out in order to define source and drain regions 151 of the transistor 150. The implantations may comprise halo/extension implants, giving rise to extension regions 151e and halo regions (not shown) in the active region 102a. After performing halo/extension implantations, the spacer structure 160 may be broadened and an additional series of implantations may be carried out in order to form deep regions 151d of the source and drain regions 151.

According to the conventional manufacturing flow, the insulating cap layer is removed from the top of the gate structure 160 before performing these implantations. Typically, the cap layer is removed after forming the gate structure 160 and before performing the halo/extension implantations. After removing the cap layer, the gate structure 160 exposes the gate material 162 to the outside, as shown in FIG. 1a.

An annealing step follows the series of implantations defining source and drain regions 151. Annealing is performed in order to activate the implanted dopant ions and to allow the crystalline structure to recover from implantation damage.

After the annealing step, a metal silicide layer is formed in order to decrease the contact resistance to the electrodes of the transistor 150. The process of metal silicide formation is schematically illustrated in FIGS. 1b and 1c.

As shown in FIG. 1b, a refractory metal layer 108 is deposited onto the exposed face of the semiconductor structure 100. The refractory metal layer 108 may comprise, for example, a metal, such as nickel, titanium, cobalt and the like. Preferably, the refractory metal layer 108 comprises nickel. The refractory metal layer 108 may also comprise platinum, which, in some cases, may promote a more homogeneous formation of nickel monosilicide.

A heat treatment is then applied to the semiconductor structure 100 in order to promote a chemical reaction between the metal atoms of the layer 108 and the silicon atoms of the exposed surface of the semiconductor structure 100.

FIG. 1c shows that, as a result of the heat treatment, nickel silicide regions 153 and 162a are formed, that substantially comprise low-resistivity nickel monosilicide. More specifically, the metal silicide layer 153 has formed partly in and partly on top of the active region 102a, thus forming an interface with the source and drain regions 151. On the other hand, the metal silicide layer 162a has formed on top of the gate structure 160, thus forming an interface with the gate material 162 exposed before the deposition of the metal layer 108. It should be noted that the silicon material contained in the sidewall spacer structure 163 and the insulating regions 102b does not substantially take part in the chemical reaction induced during the heat treatment process, as it is present in those features only as a thermally stable silicon dioxide and/or silicon nitride material.

As said above, the transistor resulting from the above-described manufacturing flow is affected by the drawback of the Schottky barrier forming at the interface between the gate metal layer 164 and the gate material 162. In order to get rid of this Schottky barrier, it would be convenient to form a metal silicide layer 162a of a thickness sufficient for directly forming an interface with the gate metal layer 164.

One method of achieving this goal is forming so-called "fully silicided" gates, wherein the metal silicide layer 162a totally replaces the gate material 162 so as to directly contact the gate metal layer 164. An example of a method of forming a fully silicided gate structure may be found in U.S. Pat. No. 6,821,887. In this application, the height of the gate structure is appropriately chosen so as to permit the reaction of all gate material with the refractive metal during the silicidation process described above.

However, the methods of forming a fully silicided gate known from the prior art use the same silicidation step for forming the metal silicide layer 153 on the source/drain regions and the metal silicide layer 162a on top of the gate, as described above. Thus, the thickness of the gate metal silicide layer 162a is correlated to the thickness of the source/drain metal silicide layer 153. This is a serious limitation, since the thickness of the source/drain metal silicide layer 153 may not be increased beyond a maximum. In general, the thickness of the source/drain metal silicide layer 153 must be considerably smaller than the thickness of the semiconductor layer 102. This problem becomes more and more urgent as the typical device sizes decrease, since reducing, for example, the gate length also requires a corresponding scaling of source and drain regions 151 in the vertical direction.

By using known methods, it is, thus, particularly difficult to obtain a fully silicided gate while maintaining the thickness of the source/drain metal silicide layer at a sufficiently low value. Therefore, a need arises for an improved transistor manufacturing method permitting formation of a source/drain metal silicide layer and a gate metal/silicide layer of desired thicknesses.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is based on the new and inventive idea that the manufacturing process of a transistor may be improved by decoupling the silicidation process of the source and drain regions from the silicidation process of the gate electrode. Based on this idea, one method of forming a transistor includes forming a gate structure onto a semiconductor layer, the gate structure exposing on its upper surface a top insulating layer formed on a gate material, forming source and drain regions of the transistor in the semiconductor layer, forming a first metal silicide layer having an interface with the source and drain regions, the first metal silicide layer being formed in the presence of the top insulating layer, removing the top insulating layer from the gate structure so as to expose the gate material after forming the first metal silicide layer, and forming a second metal silicide layer in the gate structure after removing the insulating layer, the second metal silicide layer being formed so as to at least partially replace the gate material. When forming the first metal silicide layer on the source/drain region, the gate is screened by the top insulating layer, thus preventing metal silicide from forming on top of the gate. A second metal silicide layer is subsequently formed on top of the gate structure after removing the top insulating layer. Thus, the first and the second silicidation processes are decoupled from each other. This enables independent optimization of the thickness of the first and second metal silicide layers. In particular, a fully silicided gate may be obtained without having to concurrently increase the thickness of the source/drain metal silicide layer.

Advantageously, the surface of the source and drain regions may be screened while forming the second metal silicide layer on top of the gate. In this manner, the first metal silicide layer already formed in the source/drain regions is not affected by the second silicidation process, i.e., the process resulting in formation of the second metal silicide layer on the gate. This completely decouples the first and second silicidation processes from each other.

BRIEF DESCRIPTION OF THE DRAWINGS

The disclosure may be understood by reference to the following description taken in conjunction with the accompanying drawings, in which like reference numerals identify like elements, and in which:

FIGS. 2a-2j schematically illustrate cross-sectional views of a semiconductor structure during subsequent manufacturing stages of a manufacturing process flow according to an embodiment of the present invention.

Figure 1A:
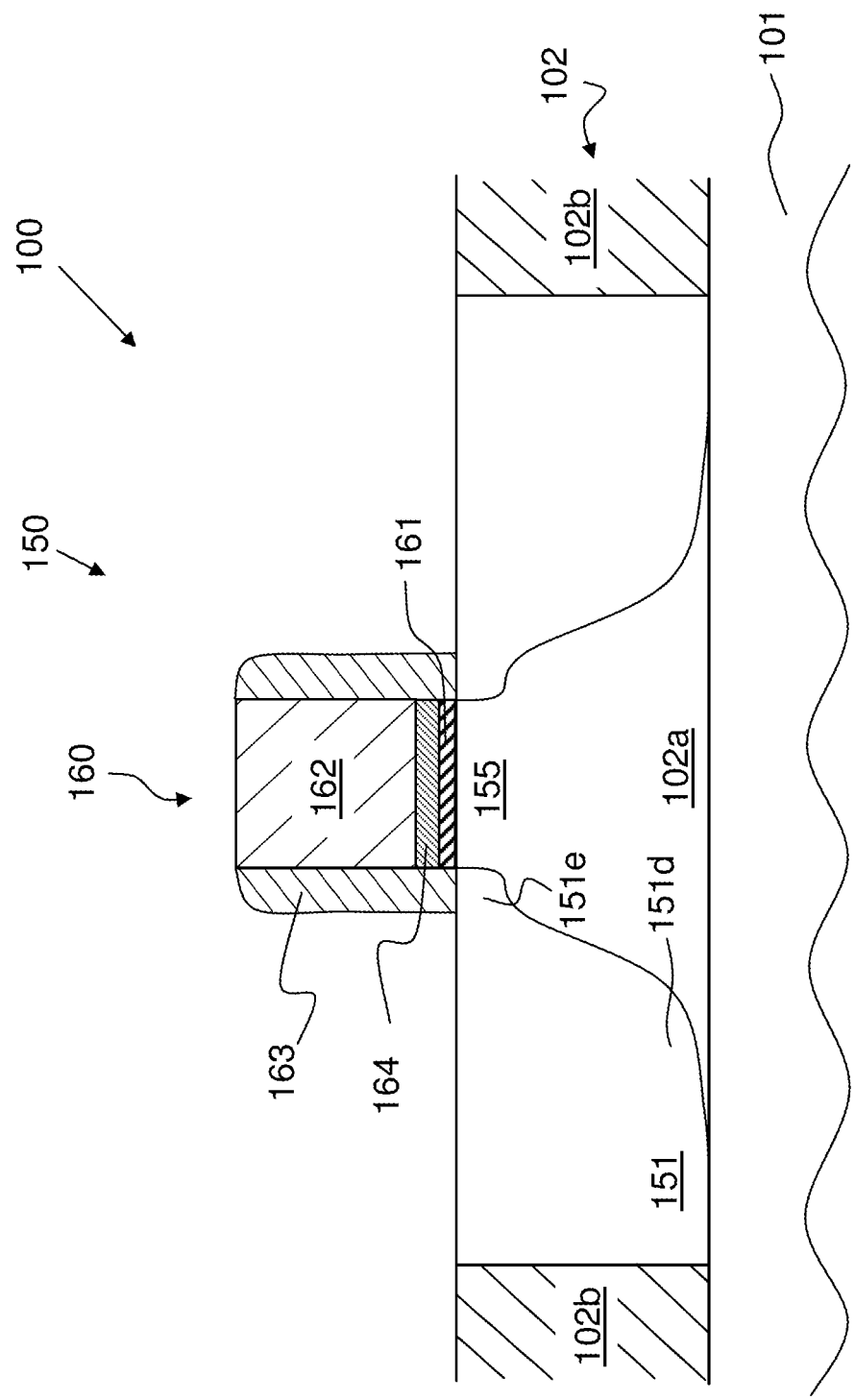
FIGS. 1a-1c schematically illustrate cross-sectional views of a semiconductor structure comprising a transistor during subsequent stages of a manufacturing process flow according to the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1B:
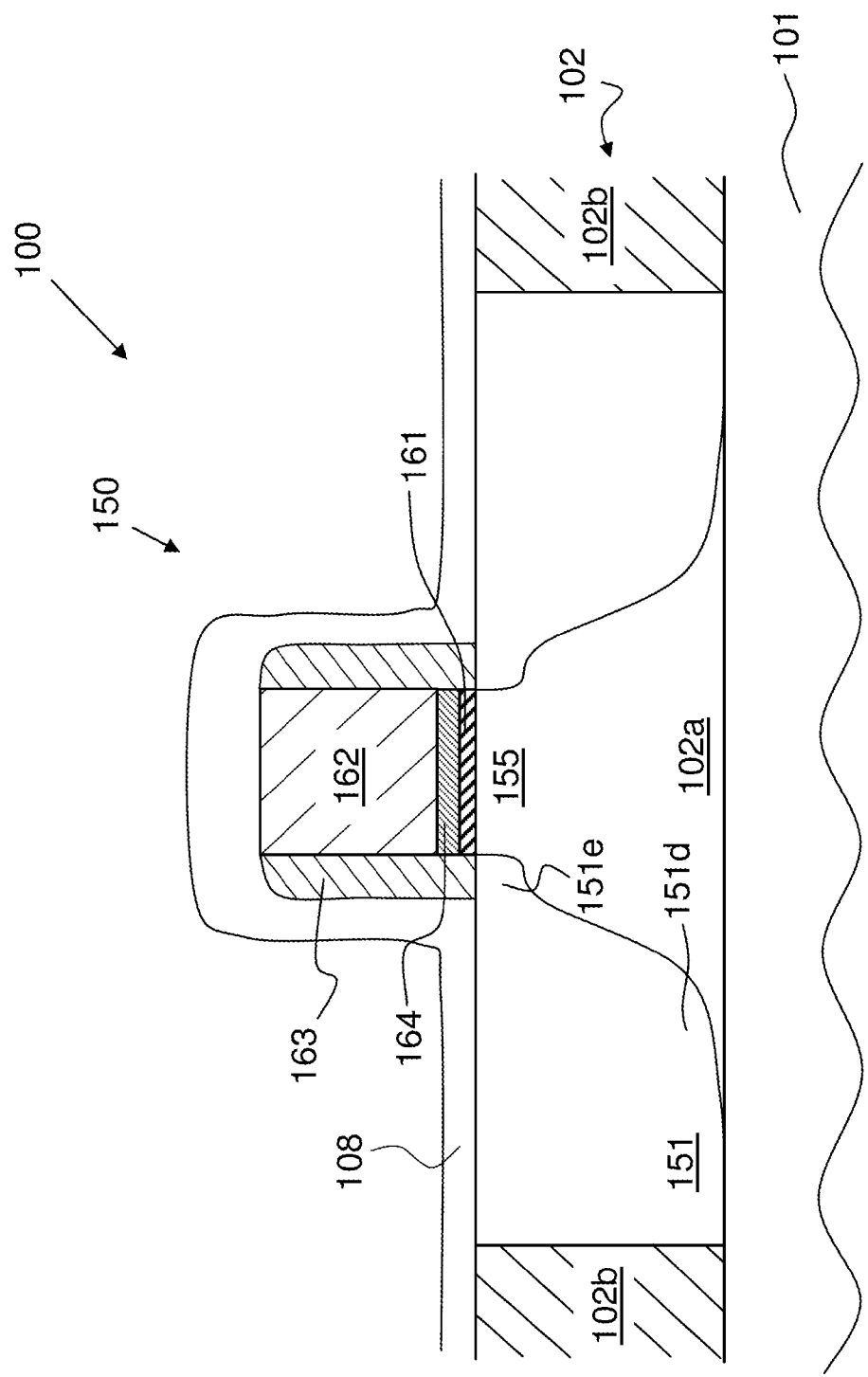
Figure 1C:
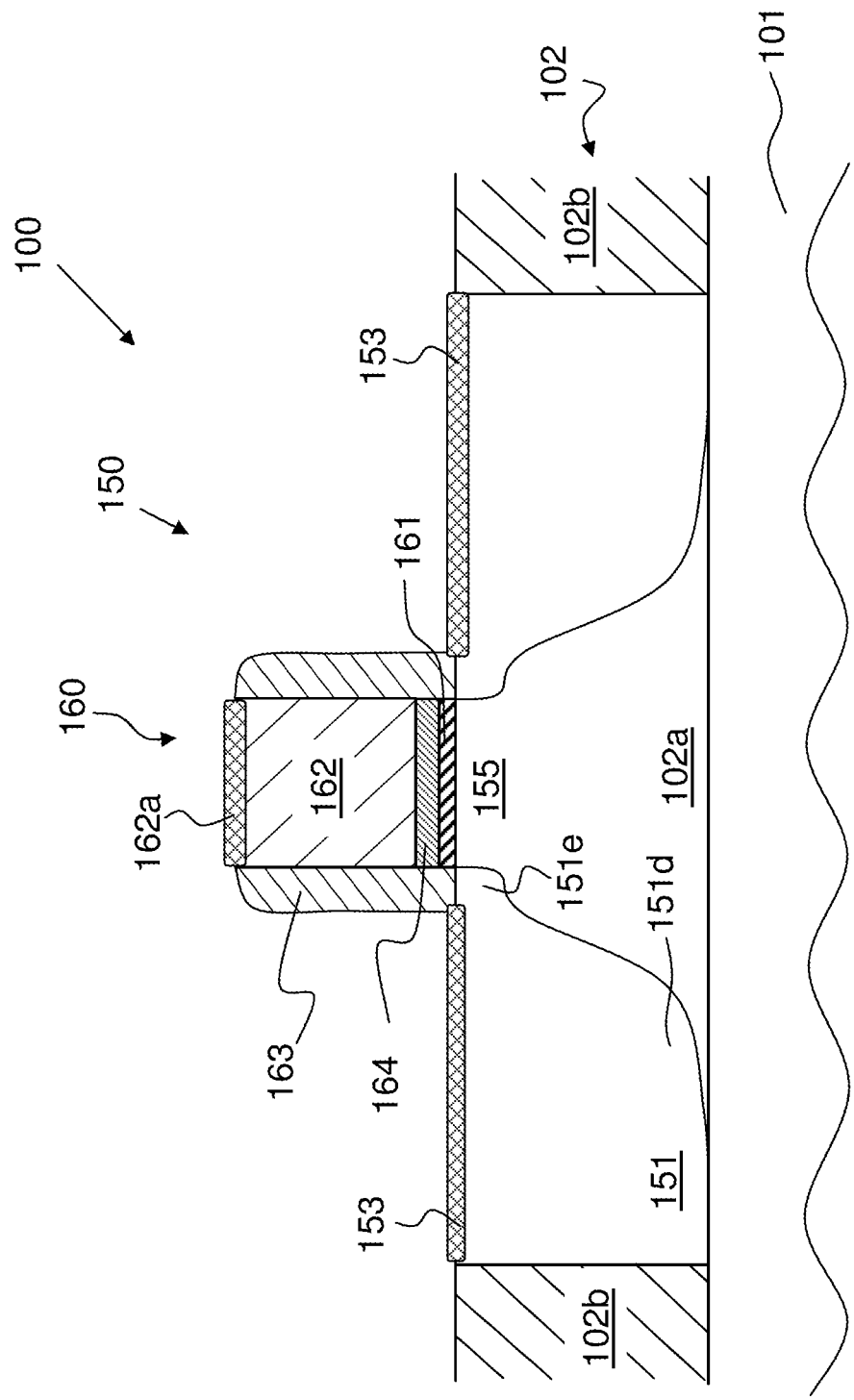

It should be noted that, where appropriate, the reference numbers used in describing the various elements illustrated in FIGS. 2a-2j substantially correspond to the reference numbers used in describing the corresponding elements illustrated in FIGS. 1a-1c above, except that the leading numeral for corresponding features has been changed from a "1" to a "2." For example, semiconductor device "100" corresponds to semiconductor device "200," gate insulation layer "161" corresponds to gate insulation layer "261," gate electrode "160" corresponds to gate electrode "260," and so on. Accordingly, the reference number designations used to identify some elements of the presently disclosed subject matter may be illustrated in the FIGS. 2a-2j but may not be specifically described in the following disclosure. In those instances, it should be understood that the numbered elements shown in FIGS. 2a-2j which are not described in detail below substantially correspond with their like-numbered counterparts illustrated in FIGS. 1a-1c, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor device 200 depicted in FIG. 2a, it should be understood that the gate electrode structure 260 is formed "above" the active region 202a and that the gate metal layer 264 is formed "below" or "under" the gate material 262.

Figure 2A:
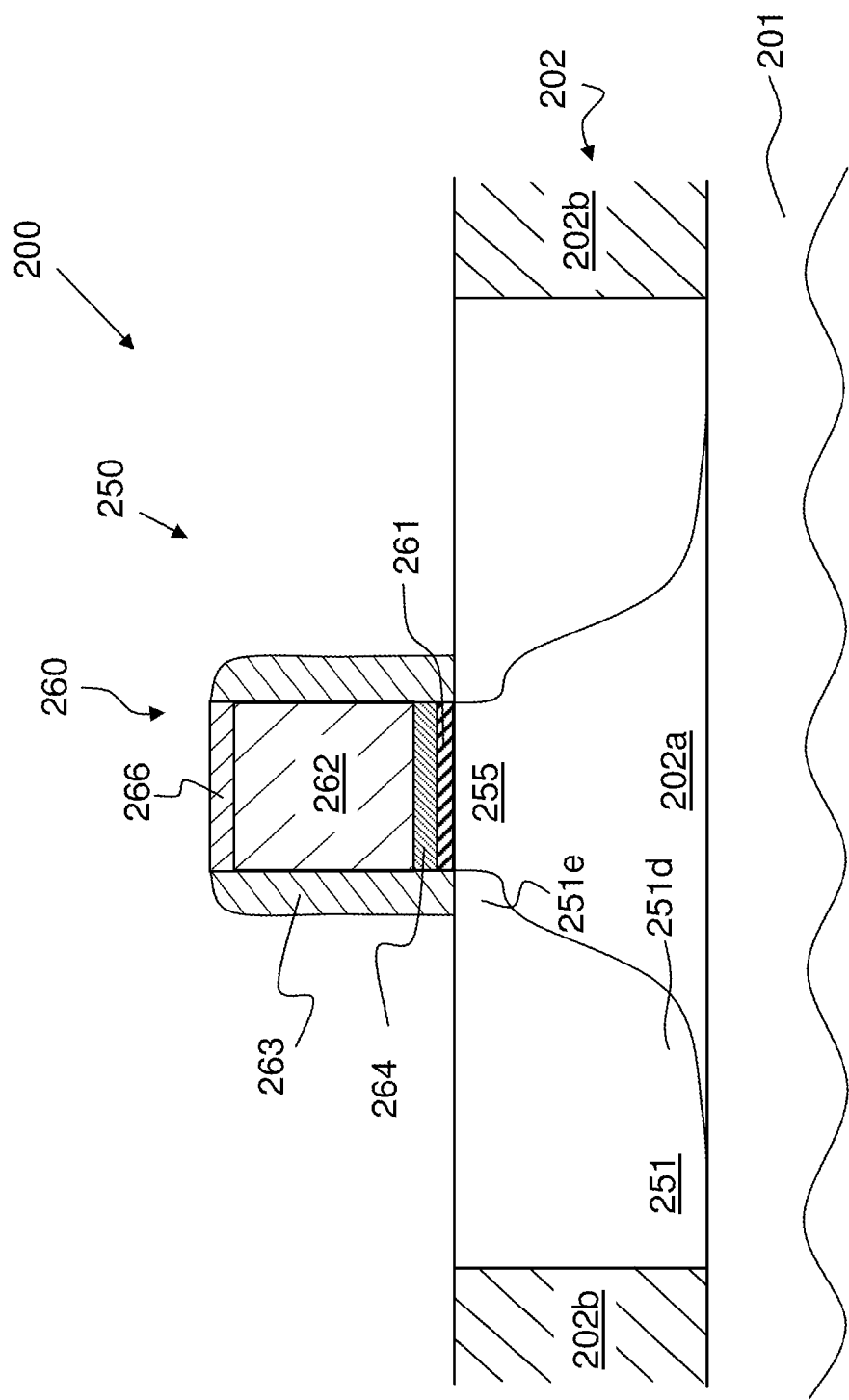

FIG. 2a shows a cross-section of a semiconductor structure 200 during an advanced manufacturing stage substantially corresponding to the fabrication method according to the prior art shown in FIG. 1a.

The semiconductor structure 200 comprises a semiconductor layer 202 in which isolation regions 202b have been formed. Isolation regions 202b may comprise, for example, shallow trench isolations. Isolation regions 202b laterally define an active region 202a. A plurality of active regions 202a may be formed in the semiconductor layer 202, although only one is shown in FIG. 2a. One or a series of implantations, e.g., well implantations, may have been performed in order to provide the active region 202a with a desired doping profile.

According to one embodiment, the semiconductor layer 202 comprises silicon. According to a particular embodiment, the semiconductor layer 202 comprises monocrystalline silicon.

The semiconductor layer 202 is formed attached to a substrate 201. The substrate 201, which may represent any appropriate carrier material, and the semiconductor layer 202 may form a silicon-on-insulator (SOI) configuration. Alternatively, the semiconductor layer 202 may be formed in the bulk of the substrate 201.

Although not shown, a thin film of a semiconductor alloy, e.g., a channel SiGe film, may have been epitaxially formed on the surface of the semiconductor layer 202.

The semiconductor structure 200 comprises a transistor 250 formed partly in and partly on the semiconductor layer 202. The transistor 250 may be a FET, for example an N-channel FET or a P-channel FET. For example, the transistor 250 may form with a second transistor of an opposite polarity (not shown) a pair used in the CMOS technology.

The transistor 250 comprises a gate structure 260, formed on the surface of the semiconductor layer 202 after having defined the active region 202a and, where needed, after forming the channel SiGe film. The gate structure 260 is preferably formed according to the HKMG technology. According to a particular embodiment, the gate structure 260 is performed according to the gate-first HKMG approach.

Thus, the gate structure 260 comprises a gate insulating layer 261 comprising a high-k material. By high-k material, it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

The gate structure 260 further comprises a gate metal layer 264 formed on the gate insulating layer 261 in order to permit threshold voltage adjustment. The gate metal layer 264 may comprise a metal such as tantalum or tungsten. Preferably, the gate metal layer 264 comprises a nitride such as, for example, titanium nitride or tantalum nitride. A certain percentage of a work function metal species, such as aluminum and the like, may be included in the gate metal layer 264, in combination with other materials.

A gate material 262 is then formed on the gate metal layer 264. Typically, the gate material 262 comprises a semiconductor. In some embodiments, the gate material 262 comprises polysilicon. As said above, a Schottky barrier is undesirably established at the interface between the gate metal layer 264 and the gate material 262.

A cap layer 266 is finally formed on top of the gate material 262. The cap layer 266 comprises an upper surface exposed towards the outside of the gate structure 260. The cap layer 266 typically comprises a tough insulator such as, for example, silicon nitride.

According to one embodiment, the length of the gate structure 260, i.e., the extension of gate material 262 along the horizontal direction in FIG. 2a, is less than 50 nm. According to a particular embodiment, the length of the gate structure 260 is 28 nm or smaller.

After forming the gate structure 260, trenches may be formed besides the gate structure 260 which may be epitaxially filled with a semiconductor alloy, e.g., an SiGe alloy. The semiconductor alloy may be embedded in the active region 202a in order to apply a predetermined stress to the channel region of the transistor 250. This may be desirable in the case of a P-channel FET, wherein a compressive strain component is known to advantageously increase the mobility of holes in the channel region.

After forming the gate structure 260 and, where needed, after embedding the semiconductor alloy in the active region 202a, source and drain regions 251 of the transistor 250 are defined. This is achieved by carrying out a series of ion implantations.

During the first implantation stage, halo regions (not shown) and extension regions 251e of the source/drain regions 251 are formed. The extension regions 251e define the length of the channel region 255 of the transistor 250. Advantageously, the spacer structure 263 may be used as an implantation mask during halo/extension implantations. The spacer structure 263 is formed on or adjacent to the sidewalls of the gate structure 260. The spacer structure 263 also carries out the task of protecting sensitive materials included in the gate stack, such as, for example, the materials included in the gate metal layer 264.

According to the method known from the prior art, the cap layer 266 of the gate structure 260 is removed before performing the halo/extension implantations. Conversely, according to the present disclosure, the cap layer 266 is maintained during halo/extension implantations.

After performing halo/extension implantations, a further implantation stage is performed in order to form deep regions 251d of the source/drain regions 251. Conveniently, the spacer structure 263 may have been broadened between the halo/extension implantations and deep implantations, so as to serve as an implantation mask of a proper thickness when performing deep implantations. Also, deep implantations are performed in the presence of the cap layer 266.

After performing halo/extension implantations and deep source/drain implantations, an annealing step is performed in order to activate the doping species and to allow the crystal lattice of the semiconductor layer 202 to recover after implantation damage.

After defining source/drain regions 251 and performing the activation annealing, a first silicidation process is carried out on the semiconductor structure 200 in order to form a metal silicide layer electrically contacting the source and drain regions 251. The first silicidation process is schematically shown in FIGS. 2b and 2c.

Figure 2B:
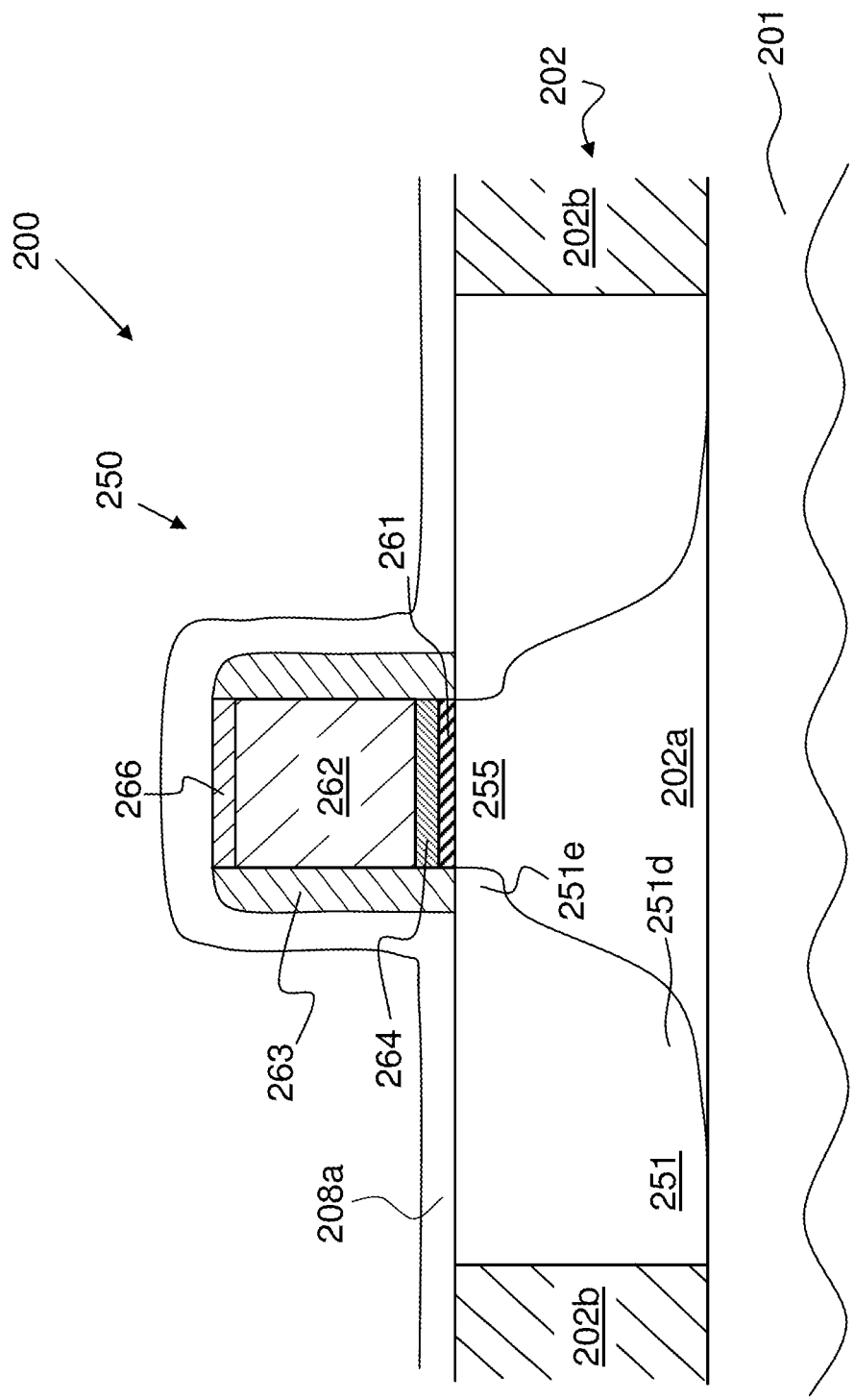

FIG. 2b shows the semiconductor structure 200 during a stage of the manufacturing process flow subsequent to the stage shown in FIG. 2a. A refractory metal layer 208a has been deposited on the surface of the semiconductor structure 200. The refractory metal layer 208a comprises any of the metals mentioned above when describing layer 108. Preferably, the refractory metal layer 208a comprises nickel. In contrast to the method according to the prior art, deposition of the refractory metal layer 208a is performed in the presence of the gate cap layer 266.

After depositing the refractory metal layer 208a, a first heat treatment is applied to the semiconductor structure 200 in order to initiate a chemical reaction between the metal atoms in layer 208a and the silicon atoms in those areas of the source and drain regions 251 that are in contact with the metal layer 208a, thereby forming metal silicide regions that substantially comprise low-resistivity nickel monosilicide. Non-reacted metal atoms of the layer 208a are removed after the first heat treatment.

Figure 2C:
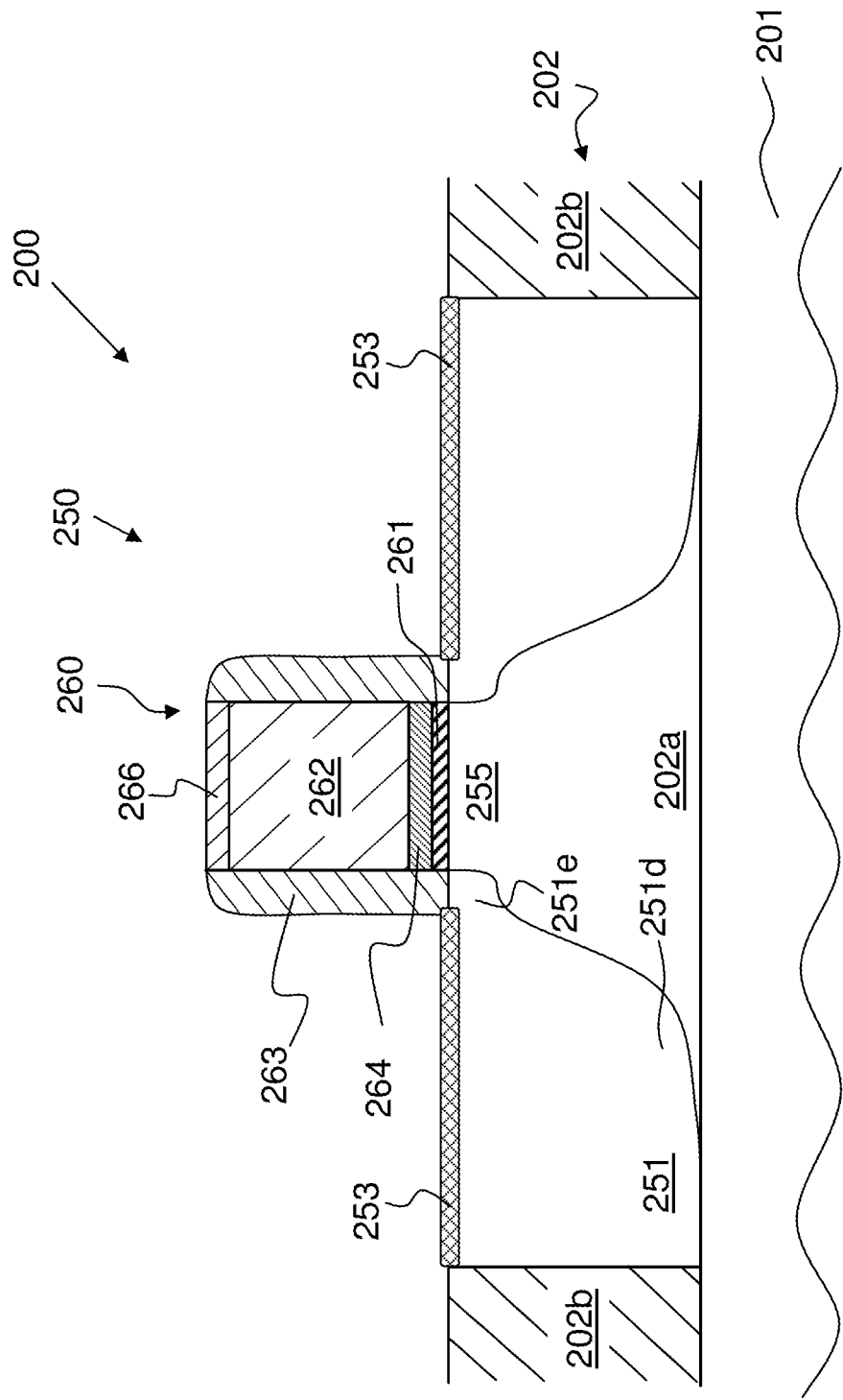

FIG. 2c shows the result of the application of the first heat treatment. A metal silicide layer 253 has formed in and on top of the active region 202a so as to form an interface with the source and drain regions 251. The metal silicide layer 253 preferably comprises nickel silicide. The thickness of the refractory metal layer 208a and the parameters of the first heat treatment, such as the temperature and the heating time, are chosen so as to obtain a desired thickness of the metal silicide layer 253.

It should be noted that, during the first heat treatment, the silicon atoms in the spacer structure 263 and in the cap layer 266 do not take part in the chemical reaction with the metal of layer 208a, since they contribute to formation of thermally stable silicon dioxide or silicon nitride layers. Thus, since the first silicidation process is carried out in the presence of the spacer structure 263 and the gate cap layer 266, no metal silicide region is formed on top of the gate structure 260 after depositing the refractory metal layer 208*a* and applying the first heating treatment. In this manner, the parameters of the first silicidation process may be chosen in order to obtain the desired thickness of the metal silicide layer 253, without affecting the characteristics of the metal silicide layer to be subsequently formed on top of the gate structure 260.

After completing the first silicidation process described above, the gate cap layer 266 is removed and a second silicidation step is performed on the semiconductor structure 200 in order to form a metal silicide layer electrically contacting the gate electrode 260 of the transistor 250. FIGS. 2*d*-2*i* schematically show the cap layer removal step and the second silicidation process according to one embodiment.

Figure 2D:
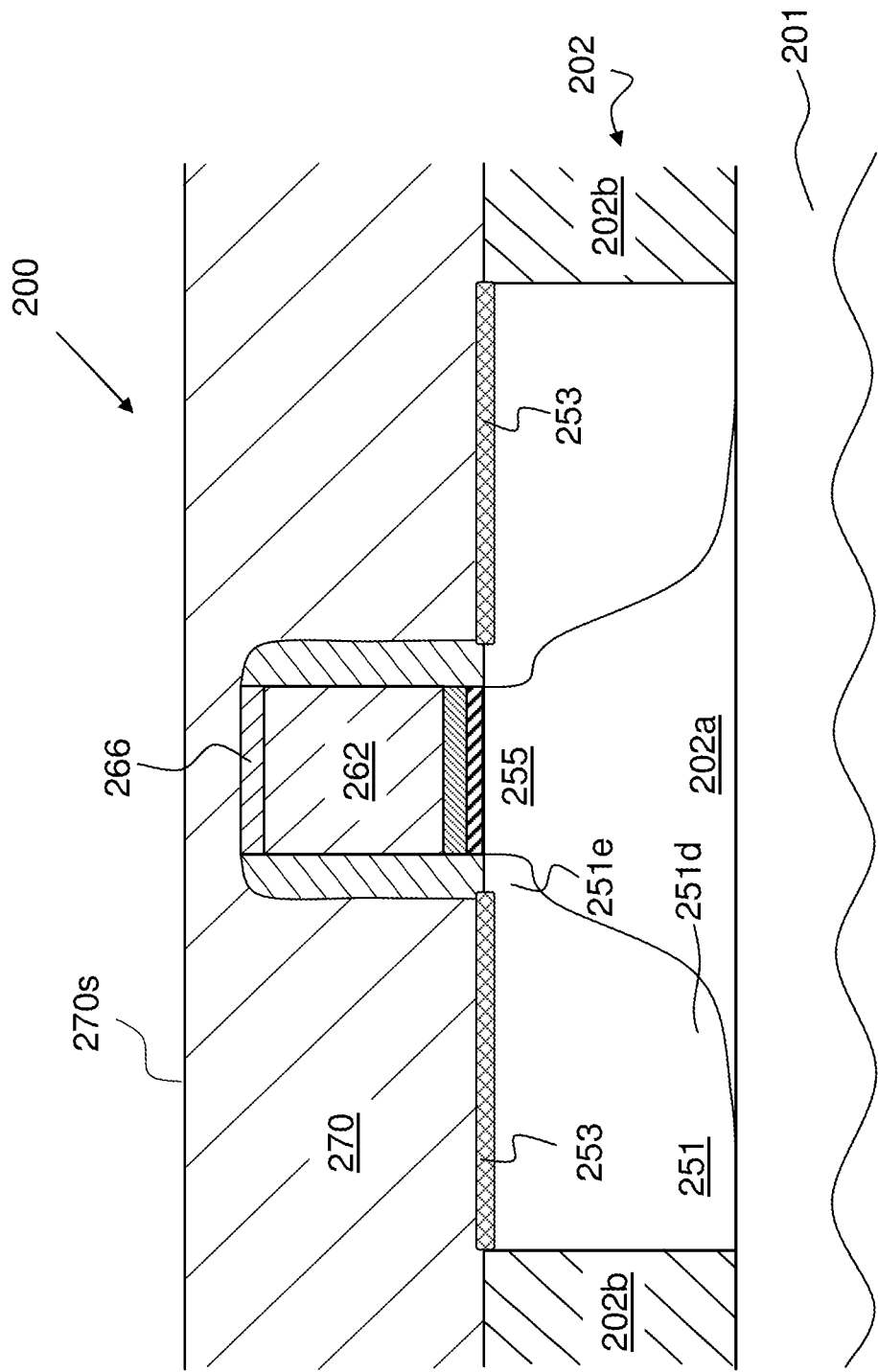

As shown in FIG. 2*d*, a coating layer 270 is deposited on the surface of the semiconductor structure 200 after performing the first silicidation process. The coating layer 270 preferably comprises a malleable material. Materials from which the coating layer 270 may be formed include: epoxies, acrylics, vinyl-based chemistries and silicon- or metal-containing organometallics. The coating layer 270 may also be a dielectric material such as butylcyclobutene (BCB), various polyimides or a low-k material. According to one advantageous embodiment, the coating layer 270 may comprise a spin-on glass.

The coating layer 270 may be deposited by using well-established film deposition techniques. According to one embodiment, the coating layer 270 is spin-coated on the surface of the semiconductor layer 200. This embodiment is preferred when the coating layer 270 comprises a spin-on glass. Preferably, the coating layer 270 is initially deposited so as to fully cover the semiconductor structure 200 without leaving any portions thereof exposed.

After being deposited, the coating layer 270 may be planarized. According to one advantageous embodiment, the coating layer 270 comprises an optical planarization layer (OPL). In this case, the coating layer 270 may be effectively planarized by pressing it against a rigid, transparent, flat surface and curing it. Curing of the coating layer 270 may be achieved by transmitting ultraviolet radiation to the coating layer 270 through the transparent surface or by heating. As a result of the planarization step, the upper surface 270*s* of the coating layer 270 is substantially flat and lies on a substantially horizontal plane, as shown in FIG. 2*d*.

As shown in FIG. 2*e*, the coating layer 270 may be back-etched after being planarized as described above with reference to FIG. 2*d*. The back-etch 281 may be an isotropic or anisotropic etch. The back-etch 281 is performed in order to remove an upper portion of the coating layer 270. In particular, the back-etch 281 removes a top portion of the coating layer 270 which is thick enough to expose an upper portion of the gate structure 260. The back-etch 281 is then carried out until the desired portion of the gate structure 260 is exposed. The portions of the surface of the semiconductor structure 220 not occupied by the gate structure 260 are still covered by the coating layer 270 after performing the back-etch 281.

Although a process has been described above wherein the coating layer 270 is planarized and back-etched, it should be understood that any process may be used resulting in a coating layer 270 screening all portions of the surface of the semiconductor structure 200 with the exception of an upper portion of the gate structure 260, as shown in FIG. 2*e*. For example, a photoresist may also be used as the coating layer 270, which could be deposited and appropriately patterned so as to only expose an upper portion of the gate structure 260.

Figure 2F:
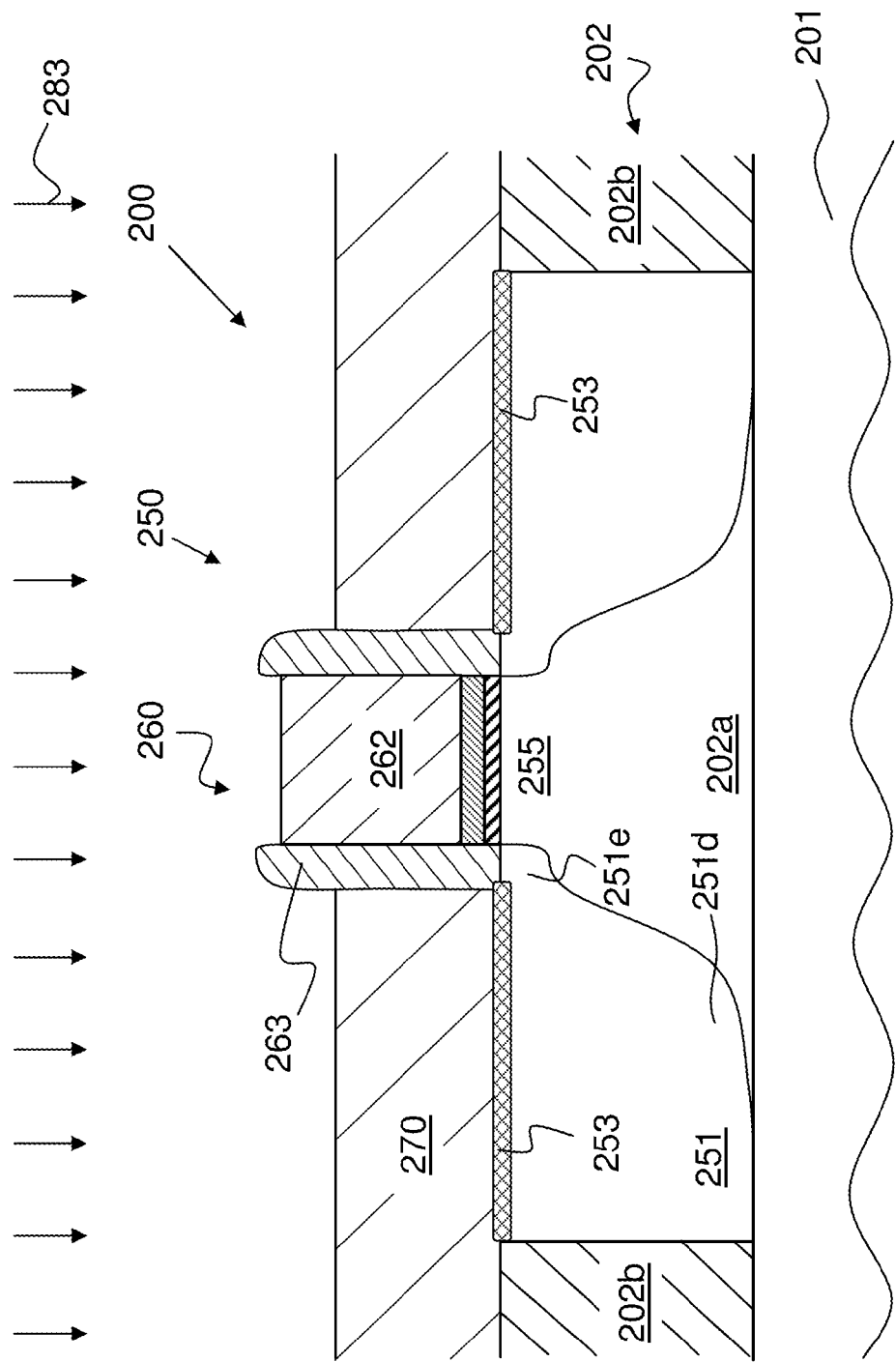

FIG. 2*f* shows that, after exposing the top portion of the gate structure 260, a further etch process 283 is performed in order to remove the cap layer 266 from the gate structure 260. The etch 283 may comprise any well-established technique which is able to remove an insulating layer such as, for example, an oxide or a nitride. After completing the etch 283, the gate material 262 is exposed towards the outside, as shown in FIG. 2*f*. It should be observed that, due to the presence of the coating layer 270, portions of the surface of the semiconductor structure 200 not included in the gate structure 260 are not affected by the etch 283.

Figure 2G:
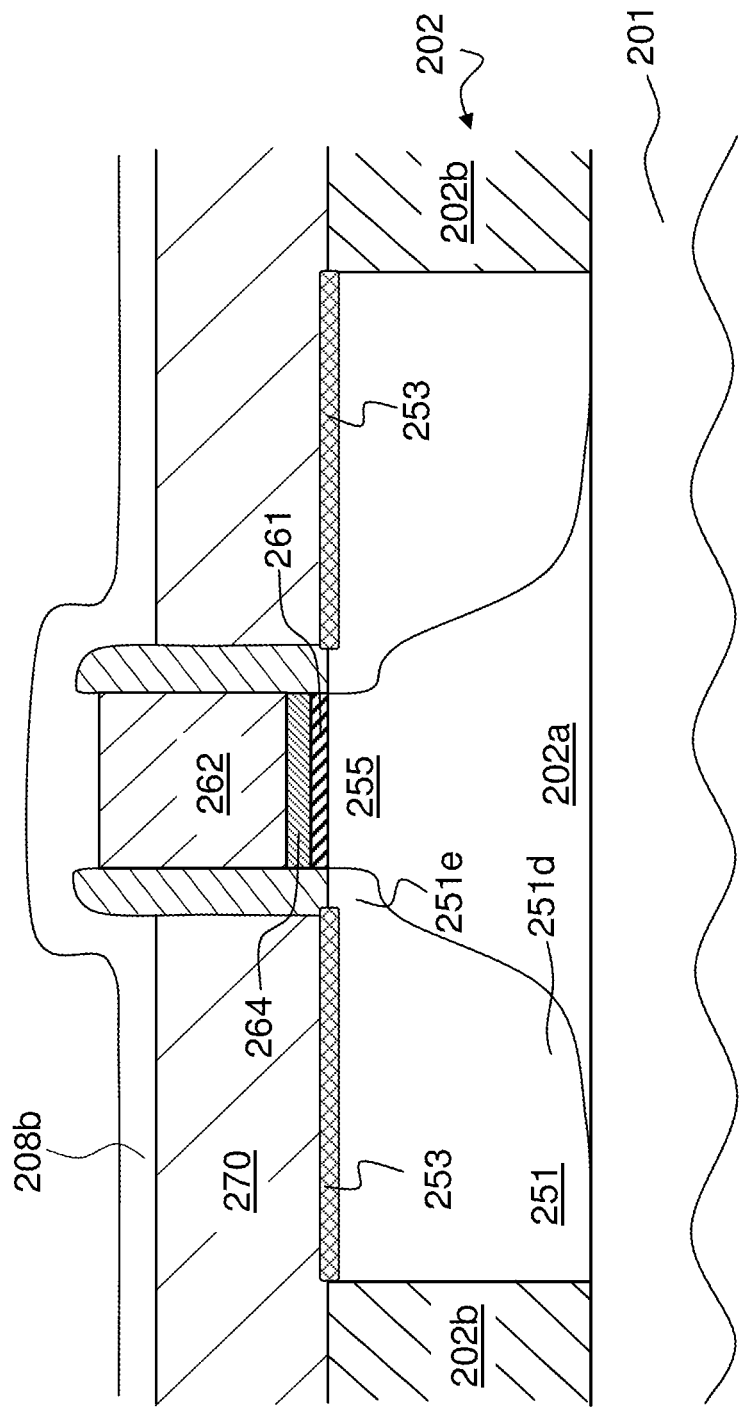
Figure 2H:
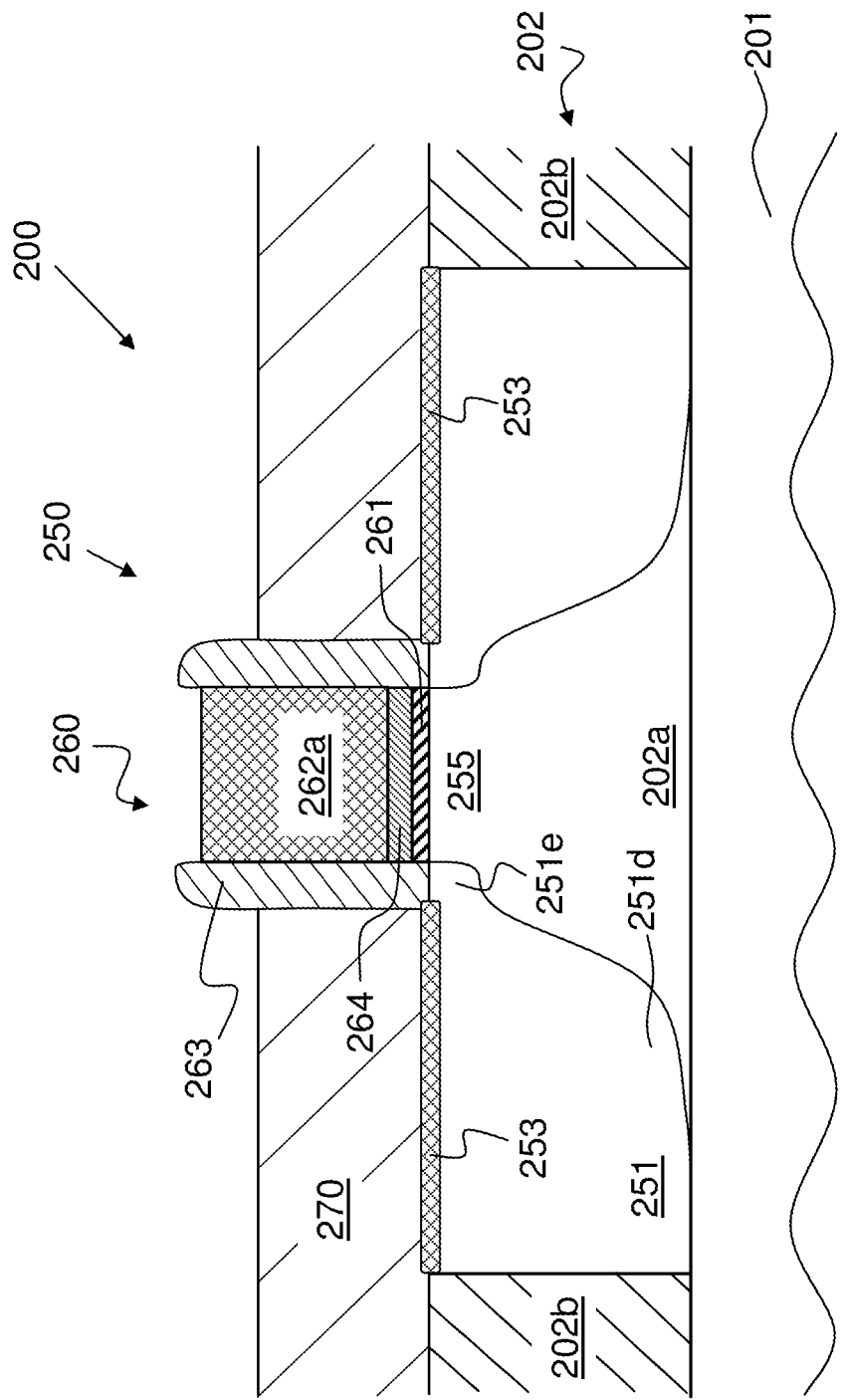

After removing the cap layer 266 from the top of the gate structure 260, a second silicidation process is carried out, as schematically shown in FIGS. 2*g* and 2*h*. With reference to FIG. 2*g*, a second refractory metal layer 208*b* is deposited on the surface of the semiconductor structure 200. Preferably, the second refractory metal layer 208*b* comprises the same materials as the first refractory metal layer 208*a*. However, the second refractory metal layer 208*b* may have a different thickness from that of the first metal layer 208*a*. The second refractory metal layer 208*b* forms an interface with the gate material 262. However, due to the presence of the coating layer 270, the metal layer 208*b* is not in contact with the surface of the active region 202*a* and is isolated from the metal silicide layer 253.

After depositing the second metal layer 208*b*, a second heat treatment is applied to the semiconductor structure 200 in order to promote a chemical reaction between the metal atoms in the layer 208*b* and the semiconductor atoms, typically silicon, in the gate material 262.

FIG. 2*h* shows the semiconductor structure 200 after completion of the second heat treatment. The chemical reaction results in the formation of a metal silicide layer 262*a* partly in and partly on top of the gate structure 260. The metal silicide layer 262*a* preferably comprises nickel silicide and decreases the contact resistance to the gate electrode. Due to the presence of the coating layer 270, the second silicidation process affects neither the metal silicide layer 253, nor the source/drain regions 251. After completing the second silicidation process, all non-reacted metal of the metal layer 208*b* is removed.

The parameters of the second silicidation process, such as, for example, the thickness of the second refractory metal layer 208*b* and the temperature and time of the second heat treatment, are advantageously chosen so that a metal silicide layer 262*a* of a desired thickness is obtained.

Formation of the metal silicide layer 262*a* occurs at the expense of the gate material 262. Thus, an increase in thickness of the metal silicide layer 262*a* usually causes a decrease in thickness of the gate material 262. FIG. 2*h* shows a particular embodiment wherein the thickness of the metal layer 208*b* is large enough and the second heat treatment is applied for a long enough time and at a high enough temperature that all semiconductor atoms in the gate material 262 react with the refractory metal layer 208*b*. The metal silicide layer 262*a* resulting from this process completely replaces the gate material 262, thereby forming an interface with the gate metal layer 264. According to the embodiment shown in FIG. 2*h*, the second silicidation process thus results in a fully silicided gate. This is advantageous in that the Schottky barrier between the gate material 262 and the gate metal layer 264 is removed, since the metal silicide layer 262*a* electrically contacts the gate metal layer 264.

Figure 2I:
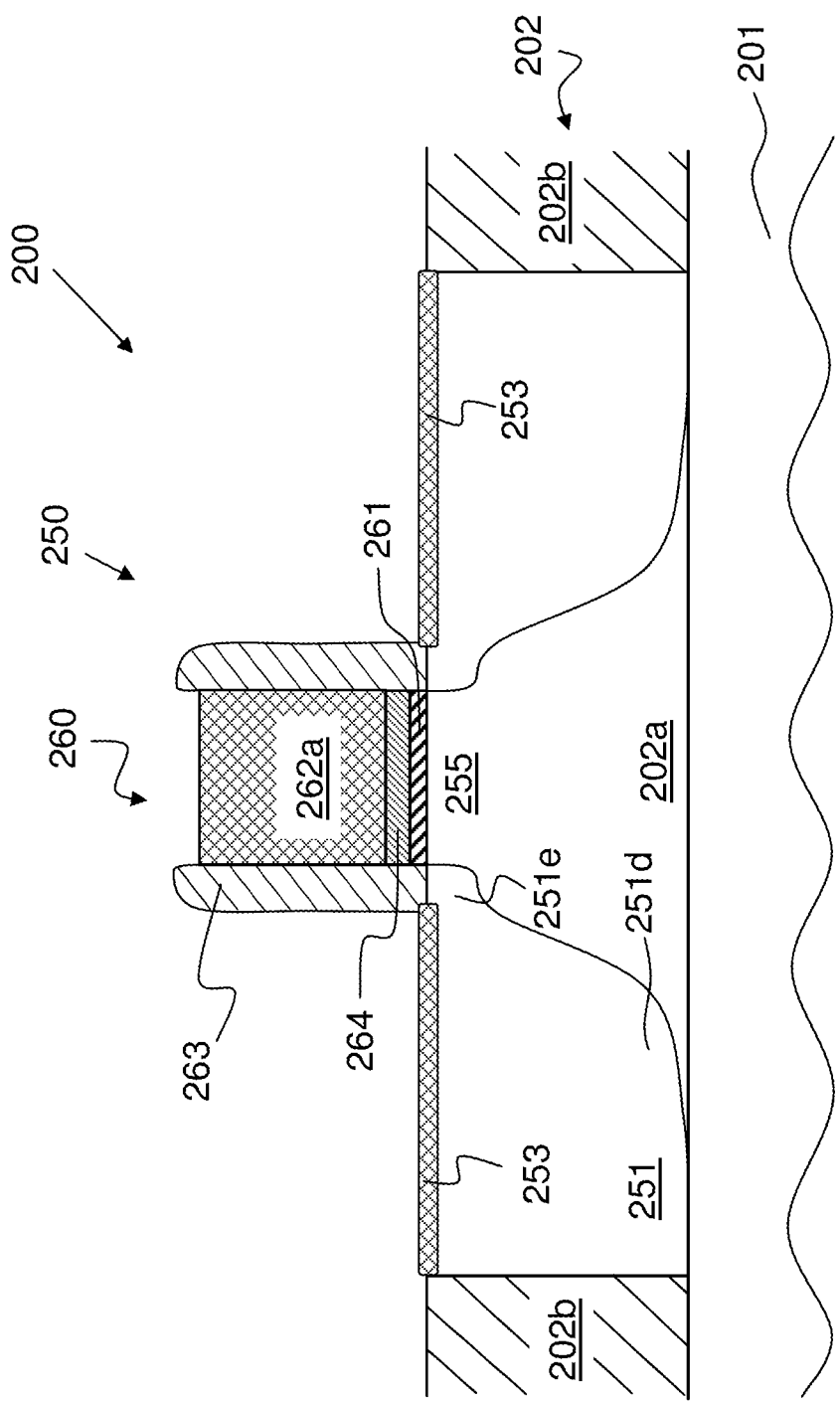

After performing the second silicidation process, the coating layer 270 may be removed. FIG. 2*i* shows the semiconductor structure 200 after the coating layer 270 has been removed. Metal silicide layers 253 and 262a are exposed to the outside for permitting electrical contact to the source/drain regions 251 and to the gate electrode 260, respectively.

Thus, according to the proposed method, the first silicidation and the second silicidation process may be decoupled from each other. Since the first silicidation process is performed in the presence of the gate cap layer 266, no metal silicide layer is formed on the gate structure 260 in the course of the first silicidation process, resulting in formation of the metal silicide layer 253. Furthermore, the second silicidation process resulting in formation of the metal silicide layer 262a in the gate 260 does not affect the metal silicide layer 253 previously formed, due to the presence of the coating layer 270. In this manner, the parameters of the first and second silicidation process may be adjusted independently of each other. This results in the possibility of forming the metal silicide layer 262a with different characteristics from the metal silicide layer 253. For example, the thicknesses of the metal silicide layers 253 and 262a may be adjusted independently. In particular, a fully silicided gate may be obtained, while maintaining the metal silicide layer 253 at an appropriately low thickness.

Figure 2J:
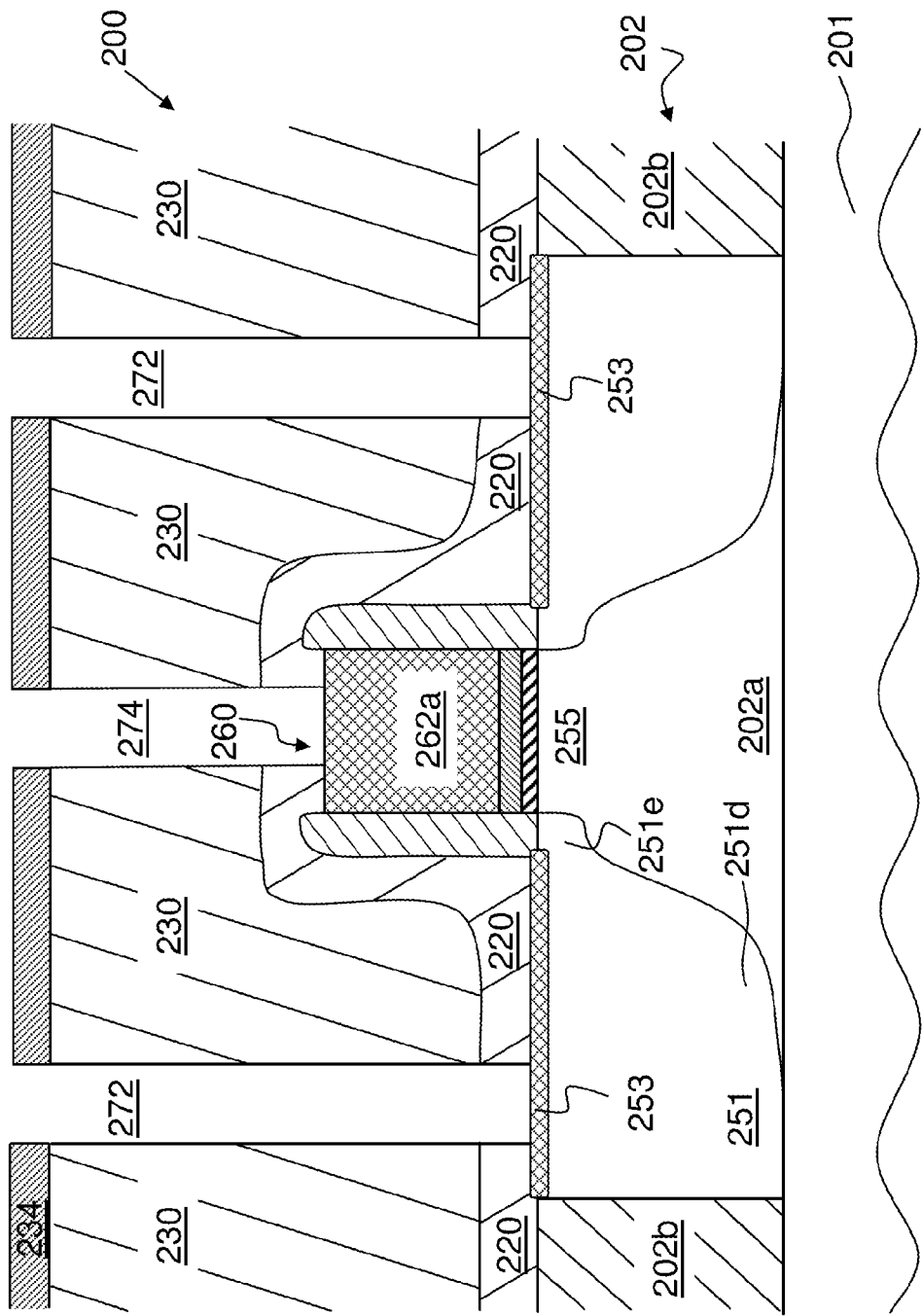

After forming metal silicide layers 253 and 262a, the manufacturing process flow continues in a conventional manner. FIG. 2j shows the semiconductor structure 200 in an advanced manufacturing process stage following that shown in FIG. 2i.

As shown in FIG. 2j, after formation of the silicide layers 253 and 262a, a stressed material layer 220 is deposited onto the surface of the semiconductor structure 200. Subsequently, a UV curing process is applied at a temperature ranging from 400-500° C.

An interlayer dielectric layer 230 is then deposited onto the stressed material layer 220. An etching process is then applied, for example, through a patterned mask 234, in order to form via openings 272 and 274. The openings 272 expose predetermined portions of the metal silicide layer 253 contacting the source and drain regions 251. On the other hand, via openings 274 expose predetermined portions of the metal silicide layer 262a contacting the gate 260.

Finally, via openings 272 and 274 may be filled with a metal, for example tungsten or copper, so as to form electrical contacts to the source and drain regions and to the gate electrode material of the transistor 250.

The present invention provides a convenient method for forming metal silicide layers contacting the source and drain regions and the gate electrode of a transistor, which may, for example, be a FET. The method finds an advantageous application in sub-50 nm fabrication technologies. The method may be advantageously applied in conjunction with the HKMG technology, particularly within the framework of the gate-first HKMG approach.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, the method comprising:
   forming a gate structure above an active region formed in a semiconductor layer, wherein said gate structure comprises a gate insulating layer comprising a high-k material, a gate metal layer comprising a work function metal species formed on and in contact with an upper surface of said gate insulating layer, a gate material formed on and in contact with an upper surface of said gate metal layer, and an insulating cap layer formed above said gate material;
   after forming said gate structure, forming source and drain regions of said transistor in said active region;
   forming a first metal silicide layer having an interface with said source and drain regions;
   after forming said first metal silicide layer, removing said insulating cap layer from said gate structure so as to expose said gate material; and
   after exposing said gate material, forming a second metal silicide layer in said gate structure, said second metal silicide being formed so as to completely replace said gate material and to form an interface with said gate metal layer.

2. The method of claim 1, further comprising, prior to forming said second metal silicide layer, forming a coating layer above said transistor, said coating layer covering said first metal silicide layer and exposing said gate structure.

3. The method of claim 2, wherein forming said coating layer comprises:
   depositing a layer of coating material so as to cover said gate structure and said source and drain regions; and
   prior to removing said insulating cap layer, removing an upper portion of said layer of coating material so as to expose an upper portion of said gate structure.

4. The method of claim 2, wherein forming said coating layer comprises performing a spin-coating deposition process.

5. The method of claim 2, wherein forming said coating layer comprises forming an optical planarization layer.

6. The method of claim 2, wherein said coating layer comprises a spin-on glass.

7. The method of claim 2, wherein forming said coating layer comprises:
   depositing a layer of coating material so as to cover said gate structure and said source and drain regions;
   pressing said layer of coating material onto a flat surface so as to planarize said layer of coating material; and
   prior to removing said insulating cap layer, curing said layer of coating material while pressing said layer of coating material.

8. The method of claim 7, wherein said flat surface is optically transparent and wherein said curing step comprises transmitting ultraviolet radiation to said layer of coating material through said optically transparent flat surface.

9. The method of claim 2, wherein said second metal silicide layer is formed in the presence of said coating layer.

10. The method of claim 2, further comprising removing said coating layer after forming said second metal silicide layer.

11. The method of claim 1, wherein said gate structure is formed according to the gate-first HKMG approach.

12. The method of claim 1, wherein said gate structure has a gate length of 28 nm or smaller.

13. The method of claim 1, wherein said transistor comprises a FET.

14. The method of claim 1, wherein said semiconductor layer comprises silicon, and wherein forming said first metal silicide layer comprises performing a silicidation process to convert an upper surface portion of said source and drain regions to said first metal silicide layer.

15. The method of claim 1, wherein forming said first metal silicide layer comprises forming a metal layer above said transistor so as to cover said insulating cap layer of said gate structure and said drain and source regions and thereafter performing a heat treatment to initiate a chemical reaction between said metal layer and a material comprising said semiconductor layer.

16. The method of claim 1, wherein said gate material comprises silicon, and wherein forming said second metal silicide layer comprises performing a silicidation process to convert an entirety of said gate material to said second metal silicide layer.

17. The method of claim 1, wherein forming said second metal silicide layer comprises covering said source and drain regions with a coating layer, forming a metal layer above said transistor so as to cover said exposed gate material of said gate structure and said coating layer covering said drain and source regions and thereafter performing a heat treatment to initiate a chemical reaction between said metal layer and said gate material.

18. A method, comprising:
forming an HKMG gate structure material stack above an active region formed in a semiconductor layer of a substrate, wherein said HKMG gate structure material stack comprises a gate insulating layer comprising a high-k material, a gate metal layer comprising a work function metal species formed on and in contact with an upper surface of said gate insulating layer, a gate material comprising silicon formed on and in contact with an upper surface of said gate metal layer, and a gate cap layer comprising an insulating material formed above said gate material;
performing a patterning process to pattern an HKMG gate structure from said HKMG gate structure material stack, said HKMG gate structure comprising said gate insulating layer, said gate metal layer, said gate material, and said gate cap layer;
performing at least one implantation process to form source and drain regions in said active region laterally adjacent to said HKMG gate structure;
forming a first layer of a first metal above said active region, said first layer contacting at least an upper surface of said source and drain regions;
performing a first heat treatment process on said first layer while said gate cap layer is covering said gate material so as to form a first metal silicide comprising said first metal in said source and drain regions;
covering said first metal silicide in said source and drain regions with a coating layer;
removing said gate cap layer from said HKMG gate structure so as to expose an upper surface of said gate material;
forming a second layer of a second metal above said active region, said second layer contacting at least said upper surface of said gate material; and
performing a second heat treatment process on said second layer while said coating layer is covering said first metal silicide in said source and drain regions so as to convert an entirety of said gate material to a second metal silicide comprising said second metal, said second metal silicide forming an interface with said gate metal layer of said HKMG gate structure.

19. The method of claim 18, wherein said first metal comprising said first metal silicide is a same metal as said second metal comprising said second metal silicide.

* * * * *